(12) United States Patent
Settergren et al.

(10) Patent No.: US 7,002,074 B2
(45) Date of Patent: Feb. 21, 2006

(54) SELF-LEADED SURFACE MOUNT COMPONENT HOLDER

(75) Inventors: Todd Settergren, Watertown, SD (US); Jimmy D. Holdahl, Watertown, SD (US)

(73) Assignee: Tyco Electronics Corporation, Middletown, PA (US)

( * ) Notice: Subject to any disclaimer, the term of this patent is extended or adjusted under 35 U.S.C. 154(b) by 618 days.

(21) Appl. No.: 10/109,162

(22) Filed: Mar. 27, 2002

(65) Prior Publication Data

US 2003/0184948 A1 Oct. 2, 2003

(51) Int. Cl.
*H05K 5/00* (2006.01)

(52) U.S. Cl. .......................... 174/52.1; 336/65; 336/92; 336/192; 336/229

(58) Field of Classification Search ................ 174/52.1, 174/52.4; 336/65, 92, 192, 229
See application file for complete search history.

(56) References Cited

U.S. PATENT DOCUMENTS

| | | | |
|---|---|---|---|
| 4,118,103 A | 10/1978 | Leidy et al. ................... 339/98 |
| 4,160,966 A | 7/1979 | Kennedy ..................... 336/155 |
| 4,424,504 A | 1/1984 | Mitsui et al. .................. 336/83 |
| 4,602,122 A | * 7/1986 | Lint .......................... 174/52.1 |
| 4,696,100 A | 9/1987 | Yamamoto et al. ........... 29/605 |
| 4,754,370 A | 6/1988 | DeTizio et al. ............. 361/404 |
| 4,760,366 A | 7/1988 | Mitsui ......................... 336/233 |
| 4,777,461 A | * 10/1988 | Sakamoto ................... 333/184 |
| 4,962,361 A | * 10/1990 | Ida .............................. 336/90 |
| 5,212,345 A | 5/1993 | Gutierrez ................... 174/52.5 |
| 5,309,130 A | 5/1994 | Lint ............................. 336/65 |
| 5,347,255 A | 9/1994 | Saitoh et al. .................. 336/83 |
| 5,351,167 A | * 9/1994 | Wai et al. .................... 361/760 |
| 5,760,669 A | 6/1998 | Dangler et al. ............... 336/65 |
| 6,252,486 B1 | 6/2001 | Wolf .......................... 336/200 |
| 6,285,272 B1 | 9/2001 | Boytor et al. ................. 336/83 |
| 6,392,519 B1 | 5/2002 | Ronning ...................... 336/90 |
| 6,456,183 B1 | 9/2002 | Basteres et al. ............ 336/200 |

FOREIGN PATENT DOCUMENTS

| | | |
|---|---|---|
| DE | 951 826 C | 11/1956 |
| DE | 1046796 B | 12/1958 |
| DE | 3615307 A | 11/1987 |
| DE | 4432739 A | 3/1996 |
| EP | 1 032 001 A1 | 2/2000 |
| GB | 2284102 | 5/1995 |
| WO | WO 99/17318 A | 4/1999 |

OTHER PUBLICATIONS

International Search Report for International Application No. PCT/US03/07494 dated Jun. 23, 2003.
International Search Report for International Application No. PCT/US03/07493 dated Jun. 23, 2003.
Patent Abstracts of Japan, vol. 1998, No. 10, Aug. 31, 1998 & Japanese Publication No. JP 10–135044 A (Kawasaki Steel Corp.), May 22, 1998 (abstract only).

* cited by examiner

*Primary Examiner*—Hung V. Ngo

(57) ABSTRACT

A self-leaded, surface mountable component package is provided for holding a wide variety of electrical components having widely variant conductor wire sizes in a manner achieving standardized conductor contact positioning. The general box-like configuration provides for component style variability and has a set of progressively stepped or tapered winding bosses to position and secure component conductors of multiple wire size, thereby ensuring proper registration with conductive traces of surface mount printed circuit boards and substrates.

12 Claims, 2 Drawing Sheets

SELF-LEADED SURFACE MOUNT COMPONENT HOLDER

BACKGROUND OF THE INVENTION

FIELD OF THE INVENTION

The present invention relates to electrical circuit component holders adapted to surface mount technology. More particularly, the present invention relates to a self-leaded surface mount component holder handling component connection wires of a variety of sizes while providing precise wire registration and a secure clinching thereof.

INTRODUCTION TO THE INVENTION

Due to the popularity and efficiency of surface mounting of electrical components onto printed circuit boards and substrates, there has been an ever increasing demand for converting non-surface-mount components into surface mount components.

Examples of surface mount component holders of the prior art are provided by U.S. Pat. No. 4,754,370 to DeTizio et al., for "Electrical Component with Added Connecting Conducting Paths", U.S. Pat. No. 5,212,345 to Gutierrez for "Self-leaded Surface Mounted Coplanar Header", U.S. Pat. No. 5,309,130 to Lint for "Self Leaded Surface Mount Coil Lead Form", and U.S. Pat. No. 5,760,669 to Dangler et al. for "Low Profile Inductor/Transformer Component".

Although a large proliferation of surface mounting options are available in the prior art, few if any such options are presently known or available to offer pick and place compatibility, flexibility for multiple component conductor sizes, and accurate placement of the component conductors (in self-leaded designs) in a single package.

BRIEF SUMMARY OF THE INVENTION

A general object of the present invention is to provide a self-leaded, surface mountable component package for holding a wide variety of electrical components having variant conductor wire sizes in a manner achieving standardized conductor contact positioning thereby overcoming limitations and drawbacks of the prior art.

Another object of the present invention is to provide a self-leaded, surface mountable component holder formed of a plastic material in a box-like configuration to hold and connect a wide variety of electrical components.

Another object of the present invention is to provide a set of winding bosses for a surface mountable component holder, each boss including a groove that converges in two dimensions or planes in order to receive and clinch a component connection wire having a diameter within a range of wire diameters adapted to be placed in the groove and clinched by narrowing portions of facing walls.

Another object of the present invention is to provide each winding boss of the holder with a set of progressively stepped or tapered steps to position and secure component conductors of multiple wire size in a manner ensuring proper registration with conductive traces of surface mount printed circuit boards and substrates as well as effectively clinching the wire, in a manner overcoming limitations and drawbacks of the prior art.

In accordance with principles and aspects of the present invention, a self-leaded surface mount component holder includes a unitary housing formed of a plastic material for containing a particular electrical component. The unitary housing includes a substantially planar top wall portion and at least two sidewall portions depending downwardly from opposite edge regions of the top wall portion to define a component cavity for receiving an electrical component therein. A plurality of winding bosses extend outwardly from each sidewall portion. Each winding boss includes a bottom face lying in a bottom plane substantially parallel with a plane of the top wall portion, an outer wall segment including an outer winding post projecting upwardly from a bottom segment including the bottom face, and an inner wall segment. Interior faces of the outer wall segment and the inner wall segment lie in converging planes in a direction substantially normal to the bottom plane and define an interior groove sized to receive and clinch a component connection wire of the electrical component after being first wrapped across the bottom segment. The winding post is provided to receive at least a portion of one wrap of the component connection wire after it has first been wrapped across the bottom wall face and through the interior groove.

The present invention also provides a self-leaded surface mount component holder including a unitary housing formed of a plastic material for containing a particular electrical component such as a toroidal coil. The housing includes a substantially planar top wall portion and two sidewall portions depending downwardly from opposite edge regions of the top wall portion thereby defining a component cavity for receiving the toroidal coil therein. A plurality of winding bosses extend outwardly from each sidewall portion and include bottom faces lying in a bottom plane substantially parallel with a plane of the top wall portion. Each winding boss also includes an outer wall segment including an outer winding post portion projecting upwardly from the bottom face and an inner wall segment. The outer wall segment and the inner wall segments have interior faces, which converge along planes substantially normal to the bottom plane and thereby define an interior groove. Most preferably, the groove is defined by a plurality of steps formed on the interior face of the inner wall segment which are generally parallel with the bottom plane and adjacent interior walls which converge relatively to an interior wall of the winding post portion, each step being of a size to receive a component connection wire of progressively smaller predetermined diameter. The holder also preferably defines a wire guide ramp extending outwardly adjacent one side of each winding boss for guiding a component connection wire into a predetermined winding position relative to the bottom face of the particular winding boss.

As one aspect of the present invention the sidewall portions extend outwardly of the top wall portion and the holder further includes a plurality of end wall portions joining outer edge regions of the sidewall portions, thereby defining two top wall access/vent openings on either side of the top wall portion.

The present invention also provides a surface mount electrical assembly including a self-leaded surface mount component holder and an electrical component such as a toroidal coil. The holder includes a unitary housing formed of a plastic material and having a substantially planar top wall portion, two sidewall portions depending downwardly from opposite edge regions of the top wall portion and extending outwardly of the top wall portion, two end wall portions joining outer edge regions of the sidewall portions thereby defining two top wall access/vent openings on either side of the top wall portion and a component cavity for receiving the electrical component therein. The holder includes a plurality of winding bosses extending outwardly on opposite outer sides of the unitary housing and including bottom faces lying in a bottom plane substantially parallel with a plane of the top wall portion. Each winding boss includes an outer wall segment including an outer winding post portion projecting upwardly from the bottom face and an inner wall segment, the outer wall segment and the inner wall segments converging in a direction substantially normal to the bottom plane thereby defining an interior groove, the groove most preferably being stepped to receive and clinch a component connection wire of one of a plurality of predetermined diameters. The component within the component cavity of the holder has plural component connection wires of one of the predetermined diameters. Each component connection wire is first wrapped across the bottom face of the winding boss, is then wound through the groove and clinched by the convergent interior faces of the outer wall segment and the inner wall segment and is then wound at least partially around the winding post portion. In this aspect of the invention, the holder preferably includes a wire guide ramp extending outwardly adjacent one side of each winding boss for guiding each component connection wire into a predetermined winding position relative to the bottom face of the winding boss.

These and other objects, advantages, aspects and features of the present invention will be more fully understood and appreciated upon consideration of the detailed description of preferred embodiments presented in conjunction with the following drawings.

BRIEF DESCRIPTION OF THE DRAWINGS

The invention is illustrated by the drawings in which

FIG. 3 shows the winding boss securing features for different size component connection wires.

DETAILED DESCRIPTION OF THE INVENTION

Figure 1:
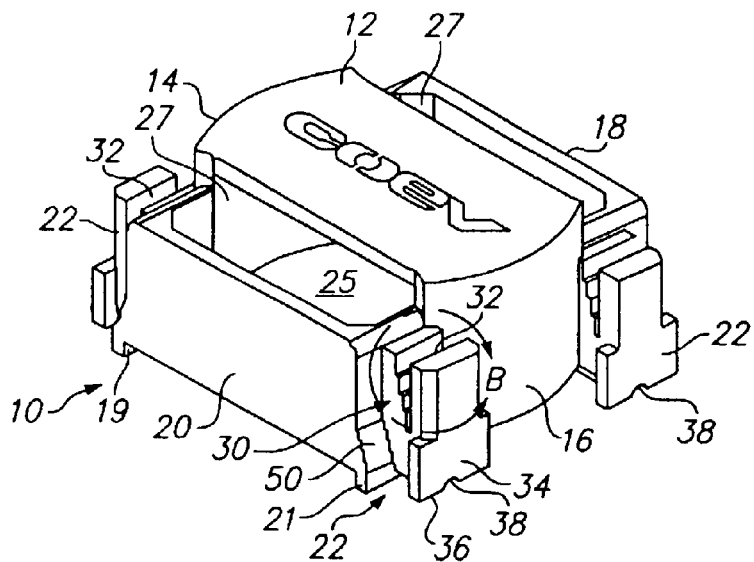
FIG. 1 is an enlarged, isometric projection of a self-leaded surface mount component holder in accordance with principles of the present invention.

A component holder 10 in accordance with principles of the present invention is integrally formed as a general box-like geometry having a top wall portion 12, curved sidewalls 14 and 16, end walls 18 and 20, and an open bottom plane to enable a component 24 to be positioned in the holder 10. The holder 10, often referred to as a "header" in the electrical component industry, is typically formed by molding of a suitable dielectric plastic material selected to satisfy the particular component application in terms of electrical and mechanical properties. As formed, the holder 10 defines an interior component cavity (denoted by reference numeral 25) that is dimensioned and configured to receive a particular electrical component, such as a toroidal coil or transformer 24 (shown in FIG. 5) through the bottom. Once the component is in place in the holder 10, a suitable potting material, compound, or other suitable means or medium, may be used to secure the component in the interior space 25. As shown in FIG. 1 the end walls 18 and 20 are located outwardly of adjacent edges of the top wall portion 12, so that openings 27 are provided to facilitate adequate cooling of the electrical component 24 in the holder 10 and to enable conductor wire ends 26 of the electrical component 24 to be passed therethrough and wrapped around appropriately positioned exterior winding bosses 22. Also, curved walls 14 and 16 extend downwardly slightly beyond end walls 18 and 20 thereby defining two elongated rails 19 and extending the length of walls 18 and 20 and lying in a bottom opening plane. In the example shown in FIG. 1 the side walls 14 and 16 are curved to accommodate a toroidal component, such as a coil or transformer wound upon a toroid core. Other shapes and geometries for the side walls of the holder 10 may be adapted and used, depending upon a particular application.

The winding bosses 22 are formed to receive and secure terminal end wires 26 of the electrical component 24 irrespective of particular wire size or diameter. The winding bosses 22 are formed and positioned to align with printed circuit connection pad locations formed on circuit boards or substrates in accordance with predetermined dimensions and locations. Two or more winding bosses may be provided by the holder 10. In the preferred arrangement shown in FIG. 1, four winding bosses 22 are formed at corners of the curved sidewalls 14 and 16. In the preferred arrangement of FIG. 5, six winding bosses are shown, with two additional winding bosses 22 being formed at end walls 18 and 20. A holder may be provided with more than six winding bosses, depending upon the surface mounting-connection requirements of a particular electrical component.

Figure 2:
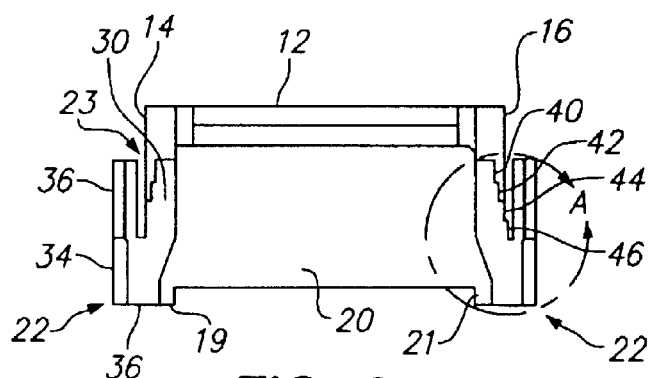
FIG. 2 is a view in front elevation of the FIG. 1 component holder.
Figure 3:
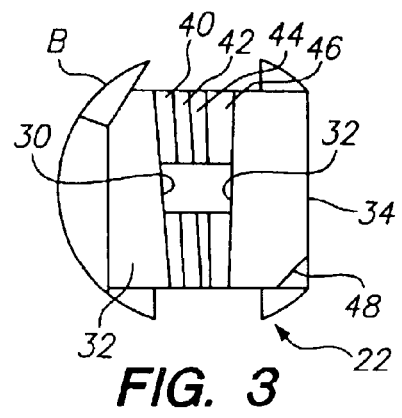
FIG. 3, showing detail B from FIG. 1, is an enlarged detail plan view of a portion of a winding boss 22 of the FIG. 1 component holder.

Each winding boss 22 defines a progressively narrowing interior groove 23. In its most general form, the groove 23 has walls that converge in two dimensions, i.e., both horizontally and vertically, see FIGS. 2 and 3. In a presently preferred form, the groove 23 is formed by an interior stepped-wall portion 30 and an inside face 32 of a winding post portion 34. A bottom face 36 of the boss 22 is aligned with the bottom plane of the holder 10. A gap 38 may be formed in the structure of the bottom face 36 to permit vapor phase solder deposition gases to pass therethrough in order to facilitate soldering the terminal end conductor to a pad of a printed circuit board or substrate.

A series of steps are formed in the stepped-wall portion 30. Four steps 40, 42, 44, and 46 are shown in the FIG. 3 detail view. More steps or fewer steps may be provided. Alternatively, the steps may be replaced with a continuous-wall Vee groove extending to an apex. Most preferably, lateral segments of the interior wall portion adjacently normal to each step 40, 42, 44, and 46 have graduated decreases in width, so that the groove 23 is wider at an opening on one side than an opening on another side. This graduated decrease in width of groove 23 provides an auto-clinching function which is sized and adapted to clinch and thereby secure a terminal end conductor wire 26 of appropriate size when it is wrapped first around the bottom face 36 and then dressed up the opposite side of the boss, then through the interior opening 23, and finally wrapped around the winding post portion 34, as shown in FIGS. 4A–4D and FIG. 5. (FIG. 5 shows a relatively large diameter wire 26 being partially wrapped around winding post portion 34.)

An end conductor wire 26 is wound around the post portion 34 of each winding boss 22 in the direction of decreasing width of groove 23, so that the winding boss 22 clinches the wire end and positively secures it in place. The dielectric plastic material from which the holder is formed is selected to be sufficiently rigid to provide effective clinching of the wire in the groove 23. An example of a preferred plastic material for holder 10 is any epoxy, phenolic, glass filled nylon, or other plastic material having appropriate mechanical properties to clinch the wire end 26 as well as withstand temperatures encountered in surface mounting soldering procedures. We currently prefer to use Ryton™ R4 glass-fiber reinforced polyphenylene sulfide, supplied by Chevron Phillips Chemical Company LP.

A chamfered edge 48 may be formed on the winding post portion 34 at the first outer corner encountered by the wire upon leaving the groove. A guide ramp or surface 50 may be formed in the wall of holder 10 adjacent the bottom face 36 of winding boss 22 to serve as a conductor guide to position the wire 26 in an appropriate outward alignment relative to the holder 10 and a corresponding winding boss 22. In this way, the portion of wire 26 that passes across the bottom face 36 will be aligned with a conductive trace of a printed circuit board to which the resultant assembly will be attached. The portion of wire 26 passing across bottom face 36 will first be suitably prepared or tinned in order to be soldered to the conductive trace as is conventionally practiced in the surface mounting art.

As seen in FIG. 5 a wire end 26 from toroidal coil 24 exits the opening between the top wall portion 12 and the endwall 20 and is dressed downwardly along a portion of side wall 16 adjacent to a winding boss 22. The wire end 26 is directed away from the sidewall 16 by the wire guide surface 50. A sharp turn is then made in the wire to direct it across the bottom face 36 of the winding boss 22 and then up the back side and into the groove 23. In the example shown in FIG. 5 the wire end 26 has a cross-sectional diameter which requires use of the widest, uppermost portion of the groove 23, defined by first step 40. The wire end 26 is drawn through the narrowing groove 23 and wrapped one-quarter turn around the winding post 34.

Figure 4A:
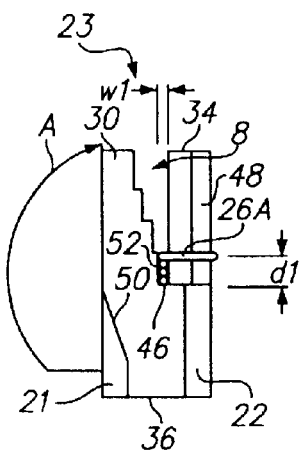
FIGS. 4A, 4B, 4C and 4D are enlarged detail end views in elevation of a winding boss 22 of the FIG. 1 component holder identified by circular view line A in FIG. 2. They show the winding boss positioning component connection wires of progressively larger size (cross-section diameter).
Figure 4B:
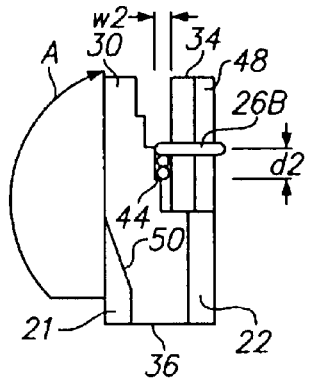
Figure 4C:
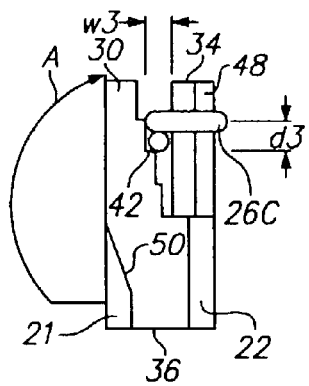
Figure 4D:
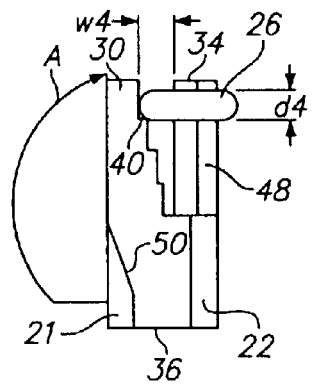
Figure 5:
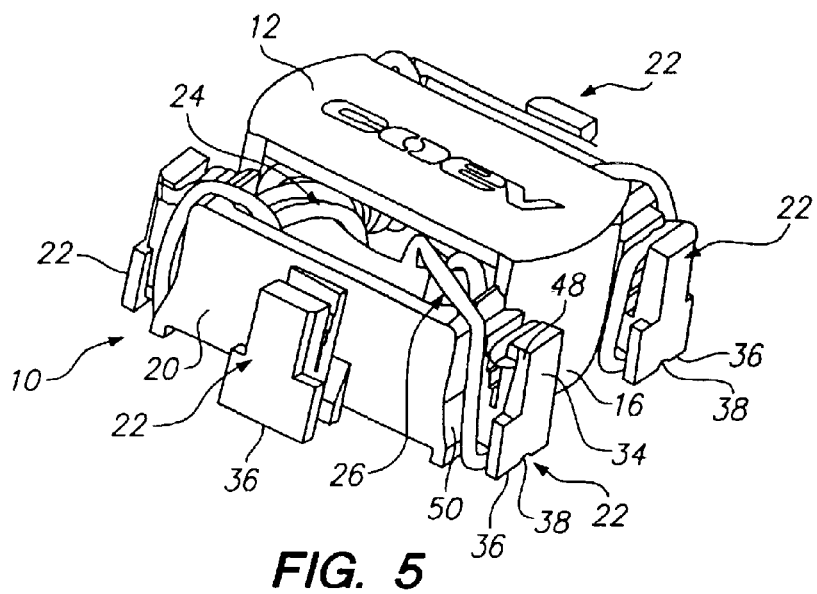
FIG. 5 is an enlarged, isometric projection of an electrical component (toroidal coil transformer) included within the FIG. 1 component holder and having coil connection wires wrapped around four winding bosses of the type shown in FIGS. 2, 3 and 4A–4D.

FIGS. 4A, 4B, 4C and 4D illustrate how the holder 10 accommodates wire ends of widely variant diameter. In FIG. 4A a conductor wire end 26A has a small diameter and fits into a deepest recess of the groove 23 defined by lowermost step 46 and having a narrowest width w1. An adjacent sidewall 52 to step 46 has a height dimension d1 set to correspond to, e.g., four diameters of wire end 26A, and four turns are made around the wrapping post 34 in this example (all but the uppermost one of the turns being cut away in FIGS. 4A, 4B, and 4C to add clarity in explaining these examples). In FIG. 4B a wire 26B of larger diameter fits into groove 23 and rests on the second step 44. In this example, the width of the groove at step 44 is w2 and the height of the wall segment adjacently above step 44 is d2. Three turns are made of wire end 26B around wrapping post 34. In FIG. 4C a wire end 26C of larger diameter is placed in groove 23 and seats against step 42. The width of the groove 23 at step 42 is w3 and the height of the wall segment adjacently above step 42 is d3. In this example two turns are made around wrapping post 34. Finally, in FIG. 4D, the conductor 26 has a sufficiently large diameter that the widest step 40 must be used, and a single turn is made around the wrapping post 34. The width of the groove 23 at step 40 is w4 and the height of the wall segment adjacently above step 40 is d4.

The stepped width of the groove 23 ensures accurate positioning for the various conductor sizes that may be used for a particular component assembly. The depth of each channel through the groove 23 is determined by the physical requirements of the assembly and how many conductors will be needed to withstand vibration and shock encountered in the intended application or use environment. As shown in FIGS. 4A–4D smaller conductor sizes will typically use two or more wraps around wrapping post 34, while larger conductors may use only a single wrap to achieve the desired mechanical and mounting strength. Alternatively, a wire pair commonly encountered with an inductor center tap may be wrapped around the winding boss 22 and secured thereto, with the groove 23 being adapted to accommodate at least two wire diameters for that particular application.

The conductor wire end is typically wrapped around the holder 10 in one of two ways. Each conductor end is either wrapped around a single winding boss as shown in FIG. 5, or each conductor end is wrapped around two adjacent winding bosses in order to accommodate two terminal components such as a toroidal single coil inductor.

Having thus described preferred embodiments of the invention, it will now be appreciated that the objects of the invention have been fully achieved, and it will be understood by those skilled in the art that many changes in construction and widely differing embodiments and applications of the invention will suggest themselves without departing from the spirit and scope of the invention. Therefore, the disclosures and descriptions herein are purely illustrative and are not intended to be in any sense limiting.

What is claimed is:

1. A self-leaded surface mount component holder comprising:
    a unitary housing formed of a plastic material for containing a particular electrical component,
    the housing including a substantially planar top wall portion and at least two sidewall portions depending downwardly from opposite edge regions of the top wall portion thereby defining a component cavity for receiving an electrical component therein,
    a plurality of winding bosses extending outwardly from each sidewall portion and including bottom faces lying in a bottom plane substantially parallel with a plane of the top wall portion,
    each winding boss also including an outer wall segment including an outer winding post projecting upwardly from a bottom segment including the bottom face and an inner wall segment, interior faces of the outer wall segment and the inner wall segment lying in converging planes in a direction substantially normal to the bottom plane and defining an interior groove being sized to receive and clinch a component connection wire of the electrical component after being first wrapped across the bottom face, the winding post for receiving at least a portion of one wrap of the connection wire after it has been wrapped across the bottom face.

2. A self-leaded surface mount component holder comprising:
    a unitary housing formed of a plastic material for containing a particular electrical component,
    the housing including a substantially planar top wall portion and at least two sidewall portions depending downwardly from opposite edge regions of the top wall portion thereby defining a component cavity for receiving an electrical component therein,
    a plurality of winding bosses extending outwardly from each sidewall portion and including bottom faces lying in a bottom plane substantially parallel with a plane of the top wall portion, each winding boss also including an outer wall segment including an outer winding post portion projecting upwardly from the bottom face and an inner wall segment, interior faces of the outer wall segment and the inner wall segments converging in two directions thereby defining an interior groove, the groove for receiving and clinching a component connection wire of one of a plurality of predetermined different diameters.

3. The self-leaded surface mount component holder set forth in claim 2 wherein the inner wall segment defines a plurality of steps generally parallel with the bottom plane and adjacent walls which converge relatively to the interior face of the outer wall segment.

4. The self-leaded surface mount component holder set forth in claim 2 further comprising a wire guide ramp extending outwardly adjacent one side of each winding boss for guiding a component connection wire into a predetermined winding position relative to the bottom face of said winding boss.

5. The self-leaded surface mount component holder set forth in claim 2 wherein the winding post portion includes a chamfered outer edge.

6. The self-leaded surface mount component holder set forth in claim 2 wherein the sidewall portions extend outwardly of the top wall portion and further comprising a plurality of end wall portions joining outer edge regions of the sidewall portions, thereby defining two top wall access/vent openings on either side of the top wall portion.

7. The self-leaded surface mount component holder set forth in claim 2 further comprising an electrical component in the component cavity having plural component connection wires of one of the predetermined diameters, each component connection wire being first wrapped across the bottom face of a said winding boss, then being dressed through said groove and clinched by the converging interior faces of the outer wall segment and the inner wall segment and then being dressed at least partially around the winding post portion.

8. The self-leaded surface mount component holder set forth in claim 7 wherein the electrical component comprises a toroidal inductor including at least one coil providing said plural component connection wires.

9. A surface mount electrical assembly comprising self-leaded surface mount component holder including a unitary housing and an electric component therein, the holder being formed of a plastic material for containing a particular electrical component and having a substantially planar top wall portion, two sidewall portions depending downwardly from opposite edge regions of the top wall portion and extending outwardly of the top wall portion, two end wall portions joining outer edge regions of the sidewall portions thereby defining two top wall access/vent openings on either side of the top wall portion and a component cavity for receiving the electrical component therein, a plurality of winding bosses extending outwardly on opposite outer sides of the unitary housing and including bottom faces lying in a bottom plane substantially parallel with a plane of the top wall portion, each winding boss also including an outer wall segment including an outer winding post portion projecting upwardly from the bottom face and an inner wall segment, interior faces of the outer wall segment and the inner wall segments converging in two directions thereby defining an interior groove, the groove being sized to receive and clinch a component connection wire having one of a plurality of predetermined different diameters capable of being received within the groove, and the electrical component in the component cavity having plural component connection wires of one of the predetermined diameters, each component connection wire being first wrapped across the bottom face of a said winding boss, then being dressed through said groove and clinched by the converging interior faces of the outer wall segment and the inner wall segment and then being wound at least partially around the winding post portion.

10. The surface mount electrical assembly set forth in claim 9 wherein the interior face of the inner wall segment defines a plurality of steps generally parallel with the bottom plane and adjacent walls which converge relatively to the interior face of the outer wall segment.

11. The surface mount electrical assembly set forth in claim 9 wherein the electrical component comprises a toroidal inductor including at least one coil having said plural component connection wires.

12. The surface mount electrical assembly set forth in claim 9 further comprising a wire guide ramp extending outwardly adjacent one side of each winding boss for guiding a component connection wire into a predetermined winding position relative to the bottom face of said winding boss.

* * * * *